(12) United States Patent
Van Bommel et al.

(10) Patent No.: US 9,429,837 B2
(45) Date of Patent: Aug. 30, 2016

(54) AQUEOUS CURABLE IMPRINTABLE MEDIUM AND PATTERNED LAYER FORMING METHOD

(75) Inventors: Ties Van Bommel, Horst (NL); Sander Frederik Wuister, Eindhoven (NL); Emile Johannes Karel Verstegen, Eindhoven (NL); Rifat Ata Mustafa Hikmet, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 801 days.

(21) Appl. No.: 12/992,219

(22) PCT Filed: May 14, 2009

(86) PCT No.: PCT/IB2009/052004
§ 371 (c)(1),
(2), (4) Date: Nov. 11, 2010

(87) PCT Pub. No.: WO2009/141774
PCT Pub. Date: Nov. 26, 2009

(65) Prior Publication Data
US 2011/0064925 A1      Mar. 17, 2011

(30) Foreign Application Priority Data
May 20, 2008     (EP) ..................................... 08156503

(51) Int. Cl.
*B32B 3/10*     (2006.01)
*C08F 2/46*     (2006.01)
(Continued)

(52) U.S. Cl.
CPC ............. *G03F 7/0002* (2013.01); *B82Y 10/00* (2013.01); *B82Y 40/00* (2013.01); *G03F 7/0755* (2013.01); *Y10T 428/24802* (2015.01)

(58) Field of Classification Search
CPC .................................................. G03F 7/0002
See application file for complete search history.

(56) References Cited

U.S. PATENT DOCUMENTS

| 4,101,513 A | 7/1978 | Fox |
| 6,204,350 B1 | 3/2001 | Liu |

(Continued)

FOREIGN PATENT DOCUMENTS

| EP | 0 592 139 | 4/1994 |
| JP | 2000-327980 | 11/2000 |

(Continued)

OTHER PUBLICATIONS

International Search Report as issued for PCT/IB2009/052004, dated Sep. 4, 2009.

(Continued)

*Primary Examiner* — Ian Rummel
(74) *Attorney, Agent, or Firm* — Pillsbury Winthrop Shaw Pittman LLP

(57) ABSTRACT

An aqueous curable imprintable medium having at least one curable compound according to Formula 1:

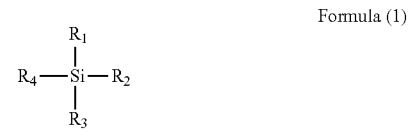

Formula (1)

wherein $R_1$-$R_3$ are hydrolysable alkoxy groups, and wherein $R_4$ is selected from the group consisting of $C_1$-$C_6$ linear alkyl groups, hydrolysable alkoxy groups and a phenyl group; and a photo-acid generator or a photo-base generator. Such a medium may have an extended shelf-life and may facilitate the formation of highly reproducible patterned layers when used in an imprint lithography process.

13 Claims, 6 Drawing Sheets

(51) Int. Cl.
  *B29C 35/08* (2006.01)
  *G03F 7/00* (2006.01)
  *B82Y 10/00* (2011.01)
  *B82Y 40/00* (2011.01)
  *G03F 7/075* (2006.01)

(56) References Cited

U.S. PATENT DOCUMENTS

| | | | |
|---|---|---|---|
| 7,354,698 B2 | 4/2008 | Van Santen | |
| 2005/0150864 A1* | 7/2005 | Stasiak et al. | 216/41 |
| 2007/0298176 A1* | 12/2007 | DiPietro et al. | 427/355 |
| 2008/0264672 A1* | 10/2008 | Markley | B82Y 10/00 174/250 |
| 2008/0284320 A1* | 11/2008 | Karkkainen | 313/504 |
| 2009/0155546 A1* | 6/2009 | Yamashita et al. | 428/195.1 |
| 2009/0256287 A1* | 10/2009 | Fu et al. | 264/447 |
| 2009/0263631 A1* | 10/2009 | Sakamoto et al. | 428/195.1 |

FOREIGN PATENT DOCUMENTS

| | | |
|---|---|---|
| WO | WO 2005/102735 | 11/2005 |
| WO | WO 2007026652 A1 * | 3/2007 |
| WO | WO 2007029542 A1 * | 3/2007 |
| WO | WO 2007144453 A1 * | 12/2007 |
| WO | WO 2008/053418 | 5/2008 |

OTHER PUBLICATIONS

Young, Sandra Kay, "Sol-Gel Science for Ceramic Materials", Material Matters, vol. 1, No. 3, 2006, pp. 8-9 (3 pages).

* cited by examiner

Rotate 90°

AQUEOUS CURABLE IMPRINTABLE MEDIUM AND PATTERNED LAYER FORMING METHOD

FIELD OF THE INVENTION

The present invention relates to an aqueous curable imprintable medium comprising a curable compound for which the curing is catalyzed by an acid or a base.

The present invention further relates to a method of forming a patterned layer on a substrate from such a medium.

BACKGROUND OF THE INVENTION

Imprint lithography is a technique in which a patterned layer such as a masking layer is formed on a semiconductor substrate by the deposition of a curable imprintable medium. The curable imprintable medium is subsequently patterned by imprinting the medium with a patterned stamp, after which the curable imprintable medium is solidified e.g. when exposed to light, e.g. UV-light to initiate the curing reaction in the medium. After the curing reaction is completed, the stamp is removed from the medium to leave a patterned layer on the semiconductor substrate.

This technique has recently drawn considerable attention because it can potentially provide a significant cost reduction over traditional lithography process steps. U.S. Pat. No. 7,354,698 discloses an example of such an imprinting method, in which the curing of the curable imprintable medium is initiated prior to the stamp imprinting step such that non-light transparent stamps can be used.

WO 2008/053418 discloses a method for forming a relief layer employing a stamp having a stamping surface including a template relief pattern in which no UV light is needed to solidify the curable imprintable medium. A solution comprising a silicon oxide compound is sandwiched between a substrate surface and the stamp surface and dried while sandwiched. The silicon oxide compound comprises a silicon atom chemically bound to at least three oxygen atoms, with, in case the silicon atom is bound to three oxygen atoms, the silicon being bound to a non-oxygen atom via a bond that is chemically inert in the relief layer forming reaction. Such silicon oxide compounds, i.e. alkoxysilanes, have the benefit that a dense cross-linked network is formed, giving the cured material excellent resist characteristics. Such compounds undergo a hydrolysis reaction followed by a water or alcohol condensation reaction in which a siloxane is formed. A more detailed description of this reaction process is disclosed in S. K Young, Sol-Gel Science for Ceramic Materials, Material Matters, 2006, Vol. 1 (3), page 8.

However, it has been found by the inventors of the present invention that curable solutions based on these types of silicon oxide compounds suffer from problems that prevent the wide applicability of these compounds in imprint lithography. For instance, the curable solution has a limited shelf-life; even at low temperatures, e.g. −20° C., some curing still takes place in the solution, as has been determined by NMR spectroscopy.

Moreover, when applying the solution onto a carrier such as a semiconductor substrate, differences in the reactivity of the solution cause problems in the reproducibility of the patterned layer formations, because the quality, i.e. curing state, of the curable imprintable medium when depositing the medium on the substrate has an impact of the characteristics of the subsequently formed patterned layer. The inventors of the present invention have found that it is difficult to consistently reproduce the relief layers formed using this solution.

This problem has been addressed in the prior art by dilution of the curable compound and acid catalyst in the solution to limit the unwanted spontaneous curing reaction. However, this has the drawback that the curing reaction on the substrate can take a considerable time to complete; this is demonstrated in FIG. 1, which shows scanning electron microscope (SEM) images of a grating formed by sol-gel imprint lithography after keeping the layer for 5 minutes in the mould (right pane), 10 minutes in the mould (middle pane) and 20 minutes in the mould (left pane) at room temperature. The images clearly demonstrate that in order to obtain a good imprint definition, the layer needs to be in the mould in excess of 10 minutes, which can result in excessive total processing times, i.e. a throughput of only a few wafers per hour, or worse in cases where a substrate layer is patterned in a stepwise manner, such as in a step and flash imprint lithography (SFIL) process.

SUMMARY OF THE INVENTION

Hence, there exists a need to provide a curable imprintable medium that overcomes at least some of the aforementioned drawbacks.

There exists a further need to provide an improved method of forming a patterned layer from such a curable imprintable medium.

According to a first aspect of the present invention, there is provided an aqueous curable imprintable medium comprising at least one curable compound according to Formula I:

(Formula 1)

wherein $R_1$-$R_3$ are hydrolysable alkoxy groups, and wherein $R_4$ is selected from the group consisting of $C_1$-$C_6$ linear alkyl groups, hydrolysable alkoxy groups and a phenyl group; and a photo-acid generator (PAG) or a photo-base generator (PBG).

A photo-acid generator or a photo-base generator is a compound that decomposes upon exposure to light of an appropriate wavelength and thereby releases an acid or a base. The photo-acid generator or photo-base generator is inactive as long as long as it is kept in the dark. The PAG or PBG may also be a compound that releases its acid or base upon exposure to a radical, with the radical being generated from a photo-sensitive compound. It has been found by the inventors of the present invention that the inclusion of a PAG or PBG significantly increases the shelf life of such an aqueous curable imprintable medium. Moreover, it has been found that the reproducibility of relief structures formed using such an aqueous curable imprintable medium has significantly improved by the inclusion of the PAG or PBG. This has the additional advantage that PAG or PBG may be added to the aqueous curable imprintable medium in a concentration that is higher than the acid concentration in the solution disclosed in WO 2008/053418, thereby reducing the curing time of the aqueous curable imprintable medium.

In an embodiment, $R_1$-$R_3$ are individually selected from —$OCH_3$ and —$OC_2H_5$ and $R_4$ is selected from —$CH_3$, —$C_2H_5$, —$OCH_3$, —$OC_2H_5$ and phenyl to reduce the organic content of the patterned layer formed from the aqueous curable imprintable medium. The selection of methoxy or ethoxy groups for R1-R3 allows for a fast hydrolysis of the Si compound as well as for the formation of a network with a high crosslink density.

Preferably, each of the one or more curable compounds is selected from the group consisting of Formulas 2-5:

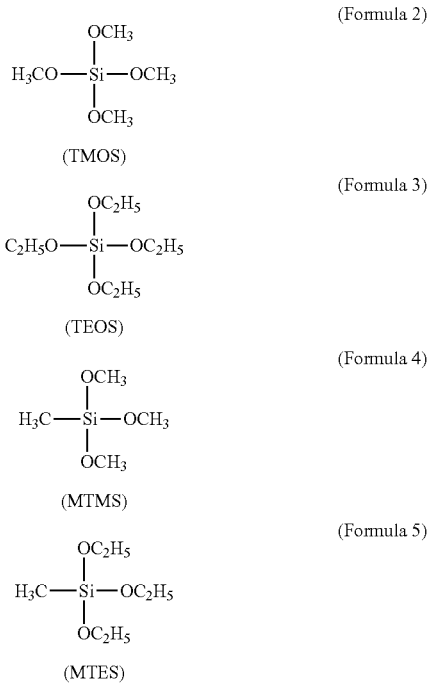

These compounds allow for the formation of highly reproducible patterned layers.

An organic solvent may be added to the aqueous curable imprintable medium to improve the layer-forming characteristics of the medium. Typically, the organic solvent has a higher vapor pressure than water at the intended deposition temperature of the aqueous curable imprintable medium to ensure that the solvent evaporates from the medium upon its deposition on a carrier such as a semiconductor substrate. A particularly suitable solvent is propylene glycol monomethyl ether acetate (PGMEA), e.g. because of the good solubility of known photo-acid generators in this solvent. Other suitable solvents for instance include propylene glycol monomethyl ether (PGME) and cyclohexanone. An alcohol may be added to increase the miscibility of the components of the medium. The aqueous curable imprintable medium may further comprise nanoparticles to reduce shrinkage of a patterned layer formed from the medium, and may also comprise a luminescent compound, e.g. a phosphor or luminescent dye, to facilitate functional modification of a semiconductor substrate carrying light-emitting elements such as light-emitting diodes by the formation of patterned layer portions on the light-emitting elements.

At this point, it is noted that WO 2005/102735 discloses a hybrid sol-gel, i.e. a sol-gel having both an inorganic and organic composition. The sol-gel may be combined with a photo-acid generator. However, it is pointed out that this prior art document does not disclose the specific curable compounds of the present invention, and is silent about the specific problems addressed by the present invention, i.e. limited shelf-life and poor reproducibility of the formed patterned layer. Therefore, the skilled person has not been given any incentive by this prior art document to solve these problems by the addition of a PAG or PBG.

The photo-activated catalyst precursor may also be any suitable precursor compound. Non-limiting examples of readily available compounds include the photo-acid generators Irgacure® PAG108, PAG103 and PAG121 marketed by Ciba®, which respectively release octane-sulfonic acid, propane-sulfonic acid and toluene-sulfonic acid on exposure to light of an appropriate wavelength.

Preferably, the photo acid generator or the photo base generator is present in the medium in a concentration in the range from 0.1 weight % to 1 weight %. In this range, short curing times are obtained without significantly increasing the organic content of the cured patterned layer. For extreme fast curing higher concentrations above 1 wt % may be used.

Combinations of photo-acid generators and photo-base generators may also be used.

According to a further aspect of the present invention, there is provided a method of forming a patterned layer on a semiconductor substrate, the method comprising depositing a layer of an aqueous curable imprintable medium according to an embodiment of the present invention on the semiconductor substrate; imprinting a patterned stamp into the curable imprintable medium layer; initiating curing the imprinted curable compound by exposing the curable imprintable medium layer to a predefined part of the electromagnetic radiation spectrum; and removing the stamp upon completion of said curing.

The fact that the curing reaction of the curable imprintable medium can be effectively postponed until after the deposition step ensures that a better reproducibility of the formed pattern layer is achieved. Moreover, because no, or at least far less, unwanted curing takes place in the curable imprintable medium, the concentration of the curable compound and/or the catalyst precursor can be increased in said medium, which means that the curing reaction can be completed much more quickly compared to prior art curable imprintable media.

The curing reaction may be initiated prior to imprinting the deposited layer with the stamp, in which case a non-transparent stamp may be used.

BRIEF DESCRIPTION OF THE DRAWINGS

Embodiments of the invention are described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

DETAILED DESCRIPTION OF EMBODIMENTS

Figure 1:
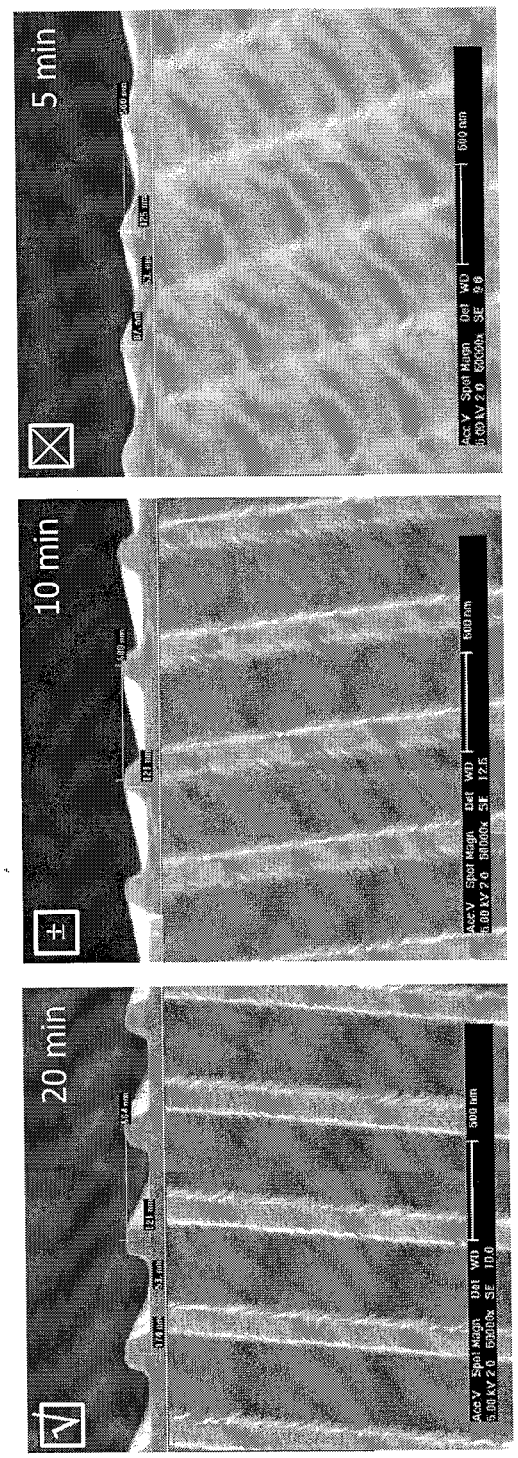
FIG. 1 shows SEM images of an imprint formed using a prior art sol-gel.

The alkoxysilanes according to Formula (1) undergo the reaction steps as shown in reaction scheme I in the presence of a catalyst such as an acid or a base. Reaction scheme 1 shows the acid-catalyzed reaction. In accordance an aspect of the present invention, the acid or base generator is activated by light of a suitable wavelength, such as UV light. Upon activation of the acid or base, the alkoxysilanes undergo a hydrolysis, which is followed by a condensation reaction between two hydrolysed alkoxysilanes (water condensation reaction) or between a hydrolysed alkoxysilane and an unreacted alkoxysilane (alcohol condensation reaction) in which the crosslinked polymer network is formed. The degree of crosslinking can be controlled by appropriate choice of the $R_4$ substituent, as has been disclosed in WO 2008/053418.

Reaction scheme I: acid-catalyzed curing reaction

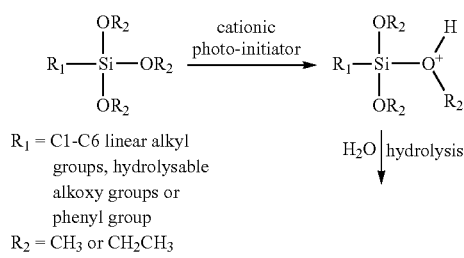

$R_1$ = C1-C6 linear alkyl groups, hydrolysable alkoxy groups or phenyl group
$R_2$ = $CH_3$ or $CH_2CH_3$

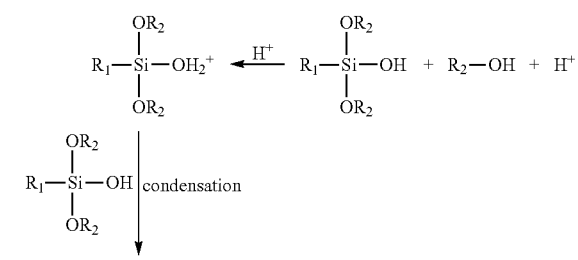

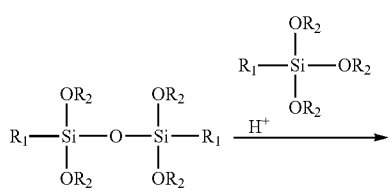

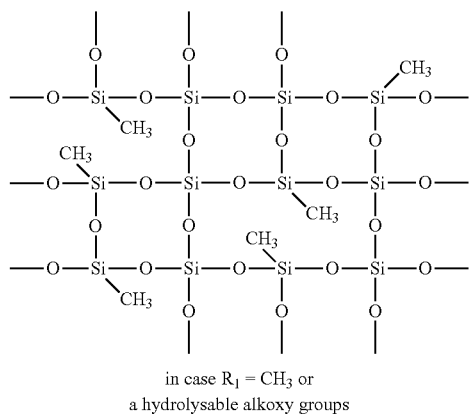

in case $R_1$ = $CH_3$ or a hydrolysable alkoxy groups

The aqueous curable imprintable medium of the present invention is commonly referred to as a sol-gel because of the fact that an integrated, crosslinked network is formed from the original chemical solution.

It is pointed out that the amount of water in the aqueous curable imprintable medium 30 of the present invention may be varied, as long as sufficient water is available to ensure that the initial hydrolysis reaction rate is sufficiently high to allow for the overall reaction to complete within a desired time period, e.g. less than 5 minutes or even less than 1 minute. The amount of water is preferably below 50 wt %, more preferably below 20 wt %, and most preferably around 10 wt %.

It has been found that the limited shelf-life and the relatively poor reproducibility of the patterned layers formed from the alkoxysilane solutions of WO 2008/053418 are caused by the presence of the acid in these solutions. These problems have been solved by the inclusion of the PAG or PBG to the aqueous curable imprintable medium of the present invention. The PAG can be an non-ionic PAG, e.g. from the class of halogenated compounds, sulfonate esters/ sulfones, as well as a ionic PAG, e.g. from the class of onium salts. Suitable PAGs include the photo-acid generators Irgacure® PAG108, PAG103 and PAG121 shown in Formula 6 and 7 and marketed by Ciba®, which respectively release octane-sulfonic acid, propane-sulfonic acid and toluene-sulfonic acid on exposure to light of an appropriate wavelength.

Formula 6

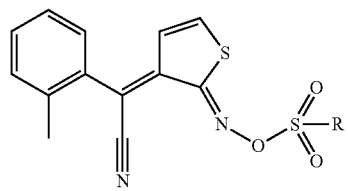

R = n-$C_3H_7$ (PAG 103), n-$C_8H_{17}$ (PAG108), n-$CH_3C_6H_4$ (PAG121)

-continued

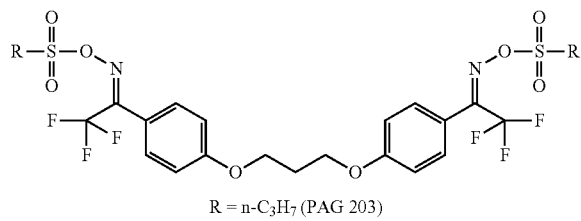

Formula 7

R = n-C₃H₇ (PAG 203)

The aqueous curable imprintable medium may further comprise a sensitizer for activating the PAG or PBG. Suitable sensitizers include radical initiators such as Irgacure 369® and Irgacure 651® from Ciba®, or a dye such as 10-thioxanthenone.

The aqueous curable imprintable medium of the present invention has the further advantage that less solvent may be used because the concentration of the curable compound in the medium may be increased without experiencing the aforementioned shelf-life and reproducibility problems. This is an important advantage because the uptake of solvent in the patterned stamp may be the rate-limiting step in imprint lithography, which is significantly accelerated by the use of a medium in accordance with the present invention.

As has been explained in WO 2008/053418, the aqueous curable imprintable medium may be further functionalized using nanoparticles, preferably having a diameter of less than 200 nm. This increases the inorganic content of the patterned layer to be formed and reduces the amount of (negative) thermal expansion in this layer. The aqueous curable imprintable medium may further comprise a luminescent material such as a phosphor or dye to be incorporated into the patterned layer. The dye may be a separate dye or a functionalized nanoparticle, e.g. a nanoparticle having a chromophore bound to its surface.

In an embodiment, the aqueous curable medium comprises a first curable component having a silicon atom chemically bound to four hydrolysable alkoxy groups and a second curable component having a silicon atom chemically bound to three hydrolysable alkoxy groups. This has the advantage that the amount of crosslinking can be controlled by varying the ratio between the first and second curable compound. Typically, an increase in the ratio towards the second curable compound reduces the crosslinking density in the network formed in the polycondensation reaction.

Figure 2:
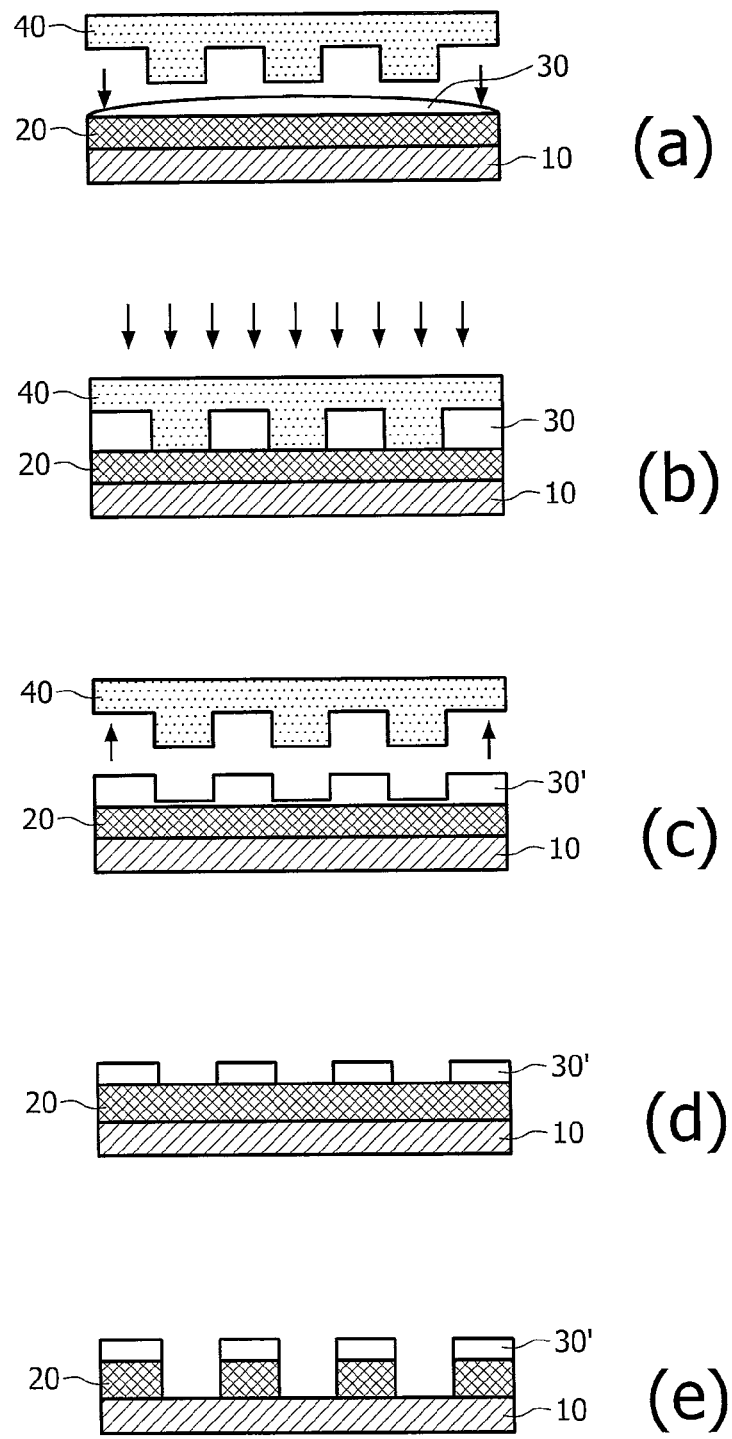
FIG. 2 shows an imprint process in accordance with an embodiment of the method of the present invention.

FIG. 2 shows an example embodiment of the method of the present invention applied in a UV imprint lithography technique. For instance, a UV surface conformal imprint lithography (UV-SCIL) technique may be used. A substrate 10, which may be any suitable semiconductor substrate, carries a further layer 20 which requires patterning. The further layer 20 may be any suitable layer, e.g. a dielectric layer. In step (a), an aqueous curable imprintable medium 30 including the curable compound according to Formula 1 and a PAG or PBG is deposited over the further layer 20. This deposition may for instance be performed by using spin coating, doctor blading, spray coating or dispensing.

Next, in step (b), a stamp 40 is imprinted into the aqueous curable imprintable medium 30, after which the aqueous curable imprintable medium 30 is exposed to a predefined part of the electromagnetic radiation spectrum, e.g. IR, visible or UV light, to activate the PAG or PBG in the medium 30. The stamp may be a hard stamp (e.g. quartz) or a soft stamp (e.g. PDMS). In an alternative embodiment, the PAG or PBG is activated immediately prior to imprinting the stamp 40 into the medium 30, which has the benefit that the stamp 40 does not have to be at least partially transparent. The stamp 40 may be made of any suitable material, e.g. polydimethylsiloxane (PDMS). During the contact between the stamp 40 and the medium 30, the water in the medium 30, as well as the solvent, if (still) present, is absorbed by the stamp 40 whilst at the same time the poly-condensation reaction of the curable compound according to Formula 1 takes place.

Upon completion of the polycondensation reaction, the stamp 40 is removed, thus yielding a crosslinked patterned layer 30', as shown in step (c). The patterned layer 30' may act as a positive or negative (photo)resist for the subsequent patterning of the further layer 20. In an optional step (d), the height of the patterned portions of the patterned layer 30' may be reduced using an additional processing step, e.g. by means of reactive ion etching. Subsequently, as shown in step (e), the further layer 20 is patterned using suitable patterning techniques, e.g. etching. It should be noted that the PAG should preferably not include metal ions such as antimony to avoid variations in the etch resistance of the patterned layer 30'. It should be understood that the above method may also be applied in imprint lithography processes other than SCIL, e.g. in SFIL.

It should also be understood that the above principle has been explained in the context of forming a patterned layer on a semiconductor substrate by way of non-limiting example only. Other suitable substrates, e.g. for the formation of optical and micromechanical devices, may also be used.

The patterned layer 30' may be incorporated into any suitable electronic device. Such an electronic device may for instance comprise a plurality of light-emitting elements, each of said elements being covered by a portion of said patterned layer, said patterned layer may comprise a luminescent material. In case of the patterned layer portions being formed in a SFIL process, these portions may comprise different luminescent materials to render light-emitting elements having individualized properties, e.g. different emission wavelengths.

Example 1

An aqueous curable medium was formed by mixing the following components:
  40 wt % g TMOS
  50 wt % g MTMS
  9 wt % g water
  <1 wt % PGMEA
  <0.2% PAG121

The above mixture was deposited by means of spin-coating on a polysilicon wafer, and subsequently imprinted with a PDMS stamp. The mixture and stamp were subsequently exposed to UV light for 6 minutes at 1 mW/cm², after which the stamp was removed.

Example 2

An aqueous curable medium was formed by mixing the following components:
  45 wt % TEOS
  45 wt % MTES
  9 wt % water
  <1 wt % PGMEA
  <0.2% PAG121

The above mixture was deposited by means of spin-coating on a polysilicon wafer, and subsequently imprinted with a PDMS stamp. The mixture and stamp were subsequently exposed to UV light for 6 minutes at 1 mW/cm$^2$, after which the stamp was removed.

Example 3

The same mixture as used in example 1 was used. The above mixture was deposited by means of spin-coating on a polysilicon wafer, and subsequently irradiated with UV light for 2.5 minutes at 1 mW/cm$^2$. The irradiated mixture was imprinted with a PDMS stamp for another 2 minutes, after which the stamp was removed.

Example 4

The same mixture as used in example 1 was used, but with a higher concentration of PAG121, namely 2 wt %. The above mixture was deposited by means of spin-coating on a polysilicon wafer, and subsequently irradiated with UV light for 1 minute at 1 mW/cm$^2$. The irradiated mixture was imprinted with a PDMS stamp for another 1 minute, after which the stamp was removed and a sub micrometer grating was obtained.

Figure 3:
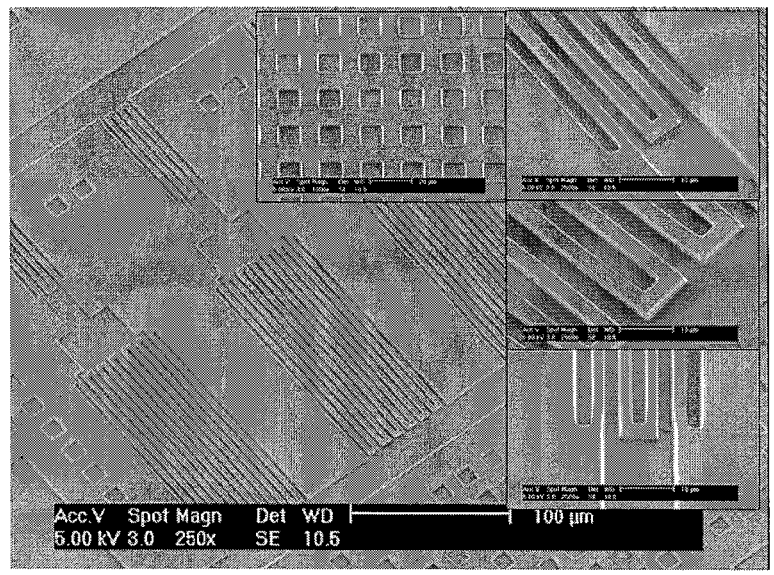
FIG. 3 shows a SEM image of an imprint structure formed in accordance with an embodiment of the method of the present invention.

FIG. 3 shows a SEM image of the imprinted micrometer size structures formed using the process of example 1. It is clearly demonstrated that a high quality relief pattern can be obtained by irradiating and imprinting aqueous medium for only 6 minutes at 1 mW/cm$^2$. This is a significant improvement over the prior art methods using comparable curable compounds, which have to be imprinted in excess of 10 minutes. Moreover, it was found that the imprinted structure could be routinely reproduced in separate experiments.

Figure 4:
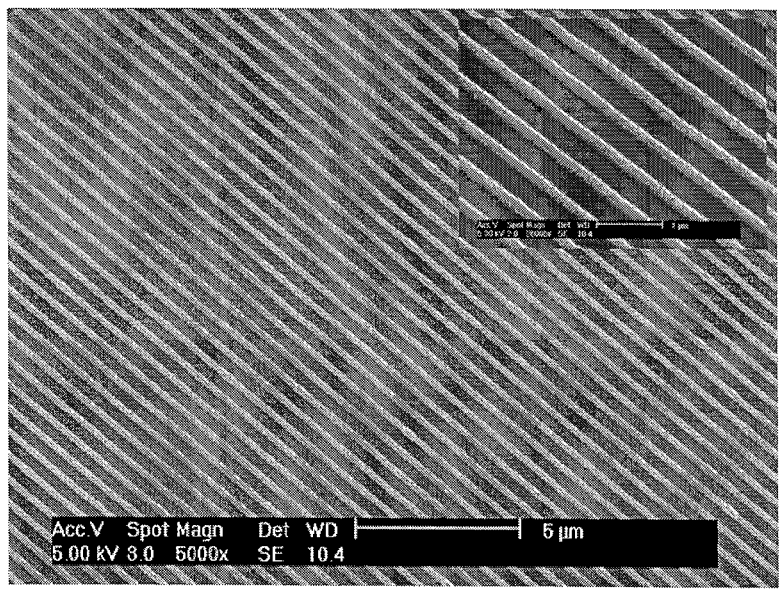
FIG. 4 shows a SEM image of another imprint structure formed in accordance with an embodiment of the method of the present invention.

FIG. 4 shows a SEM image of the imprinted grating structure having 200 nm sized features at a 600 nm pitch formed using the process of example 2. It is again clearly demonstrated that a high quality relief pattern can be obtained by irradiating and imprinting the aqueous medium for only 6 minutes at 1 mW/cm$^2$. It was again found that the imprinted structure could be routinely reproduced in separate experiments.

It is pointed out that relatively low UV irradiation intensities were used in the above examples to demonstrate the principles of the present invention. Nowadays, intensities of 100 mW/cm$^2$ are routinely used in UV imprint lithography processes. Such intensities would reduce the required curing time of the aqueous imprintable curable medium of the present invention to well below 1 minute.

Figure 5:
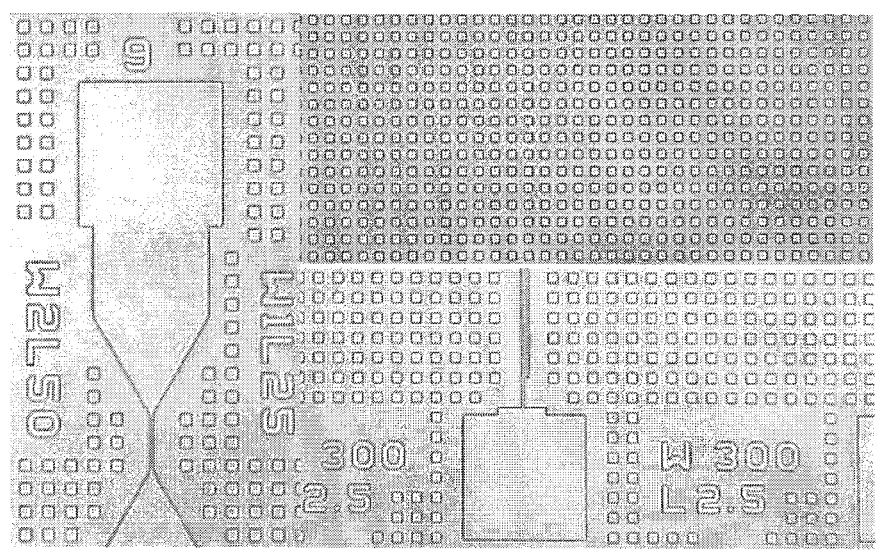
FIG. 5 shows a microscope image of another imprint structure formed in accordance with an embodiment of the method of the present invention.

The curing time may be further reduced by irradiating the aqueous imprintable curable medium of the present invention prior to imprinting the medium 30 with the stamp 40. Preliminary experiments have demonstrated that good quality patterns can be achieved by imprinting the medium 30 for no more than 2 minutes, which implies a throughput of 30 wafers per hour in a SCIL process. FIG. 5 shows a microscope picture of several structures obtained using the imprint lithography process of example 3. It has been demonstrated that a wide variety of different structures can also be formed relatively quickly and with high reproducibility when irradiating the medium prior to imprinting it with a patterned stamp.

The curing time may be further reduced by increasing the amount of PAG or PBG in the medium 30.

At this point, it is noted that due to the fact that the aqueous curable imprintable medium of the present invention can be used to achieve cured patterned layer with a high inorganic content and high crosslinking density, the curable imprintable medium of the present invention in particularly suitable for the formation of multi-layer structures, such as three-dimensional structures that have tuned optical properties, e.g. light emitting diodes, interferometers, photonic crystals and so on. Such structures could not be satisfactorily made with prior art curable media because of the lower inorganic content fraction in the polymers formed from these media, which impaired the structural integrity of the layers formed with these polymers, thus yielding unstable multi-layer structures.

Figure 6A:
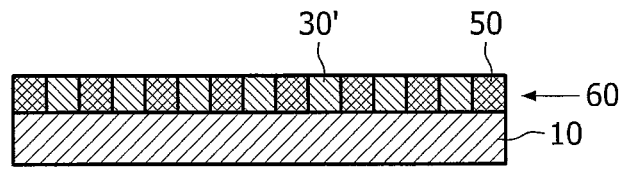
FIG. 6A to E show a schematic process flow with a number of steps according to the invention for preparing a patterned structure.

Referring to FIG. 6A, a structure 60 is formed on a substrate 10. The structure 60 is produced by UV imprint lithography (e.g. UV-SCIL) using the aqueous curable medium 30 in accordance with the method shown in FIG. 2. In addition, the patterned layer formed by portions 30' is filled, i.e. planarized with a filling material 50, which may be any thermally degradable material such as a thermally degrable polymer (TDP). A non-limiting example of a TDP is polynorbornene. Alternatively, the filling material 50 may be soluble in a particular solvent. In general, any filling material 50 that can be selectively removed from a formed multi-layer structure without damaging the patterned portions 30' may be used.

Figure 6B:
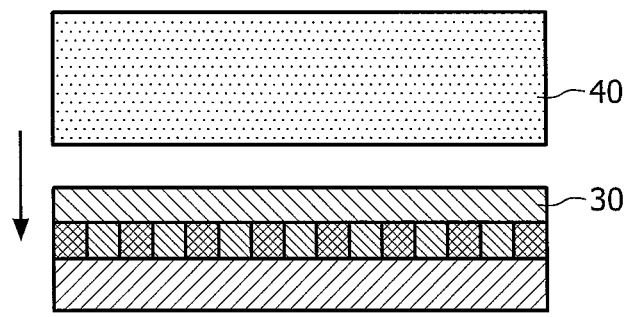
Figure 6C:
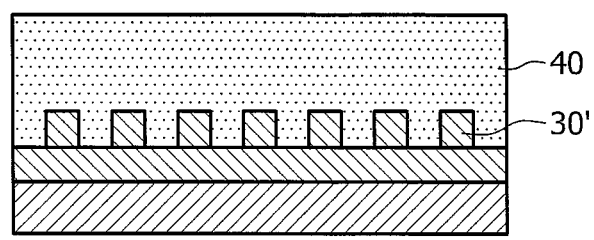

Referring to FIG. 6B, a next layer of the aqueous curable medium 30 is applied over the planarized structure 60 of FIG. 6A in any suitable manner, e.g. by spincoating, dispensing or doctor blading. The medium 30 deposited in FIG. 6B is subsequently embossed by a suitably patterned stamp 40 after alignment of the stamp with respect to the substrate 10, as shown in FIG. 6C. In FIG. 6C, the imprint orientation of the stamp 40 with the substrate 10 has been rotated 90° with respect to the imprint orientation used to form the patterned layer 30' of the structure 60. It will be appreciated that other orientation rotation angles are equally feasible.

Figure 6D:
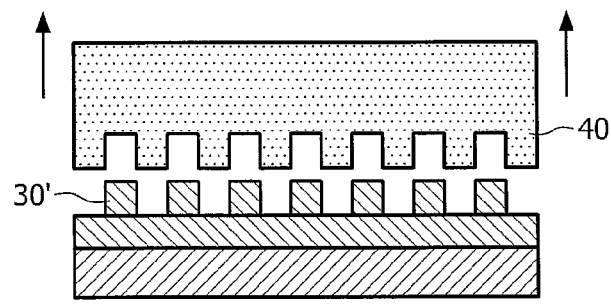
Figure 6E:
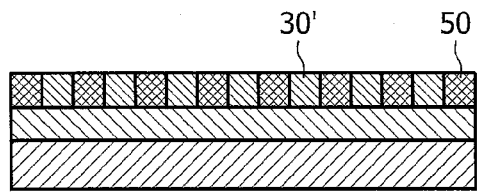
Figure 6F:
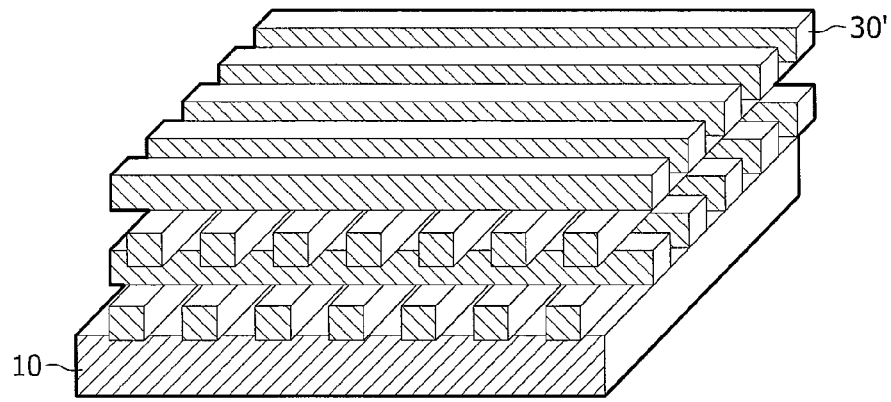
FIG. 6F shows a stacked structure obtained by performing the steps of FIG. 6A to E in four consecutive cycles.

The aqueous curable imprintable medium 30 is subsequently solidified by UV-exposure to form solidified portions 30' as shown in FIG. 6C. Removing the stamp 40 leaves the solidified portions 30' on the filled structure 60 of FIG. 6A as shown in FIG. 6D. The newly formed patterned layer may again be planarized as shown in FIG. 6E, after which additional layers may be formed by repeating the steps of FIG. 6B-E FIG. 6F shows an example of a stacked structure 70 consisting four structured layers 30 which stacked structure results after repeating the steps of FIG. 6B-E four times.

The filling material 50 can be removed afterwards by e.g. dissolving the filling material 50 in a suitable solvent or by thermal decomposition, thus yielding a stacked structure 70. The medium 30 is very suitable for application in this method because it can withstand most solvents which are needed to dissolve the filling material 50, as well as withstand high temperatures up to 600 or even 1000° C., thereby making it particularly suitable for use with thermally degradable compounds such as a TDP.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A method of a forming a patterned layer on a substrate, the method comprising:
depositing a layer of an aqueous curable imprintable medium on the substrate, the aqueous curable imprintable medium comprising:
at least one first curable compound according to Formula 1:

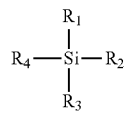

Formula (1)

wherein $R_1$-$R_3$ are hydrolysable alkoxy groups, and wherein $R_4$ is selected from the group consisting of a $C_1$-$C_6$ linear alkyl group and a phenyl group, at least one second curable compound comprising a silicon atom chemically bound to four hydrolysable alkoxy groups, and
a photo-acid generator or a photo-base generator;
imprinting a patterned stamp into the curable imprintable medium layer;
initiating curing the curable imprintable medium by exposing the curable imprintable medium layer to a predefined part of the electromagnetic radiation spectrum;
removing the stamp upon completion of said curing;
filling the regions in between the patterned layer with a filler material;
forming a further patterned layer on top of the filled patterned layer by repeating the depositing, imprinting, initiating and removing; and
removing the filler material after forming the further patterned layer.

2. A method according to claim 1, wherein the substrate comprises a further layer, and said depositing step comprises depositing a layer of the aqueous curable imprintable medium on the further layer, the method further comprising:
etching away regions of the further layer that are not covered by the cured imprintable medium.

3. A method according to claim 1, wherein said curing step is initiated prior to said imprinting step.

4. A method according to claim 1, wherein $R_1$-$R_3$ are individually selected from —$OCH_3$ and –$OC_2H_5$ and $R_4$ is selected from —$CH_3$, —$C_2H_5$, and phenyl.

5. A method according to claim 1, wherein the at least one first curable compound is selected from the group consisting of Formulas 2 and 3:

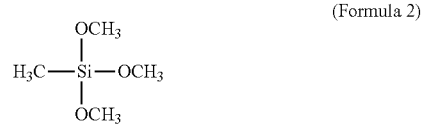

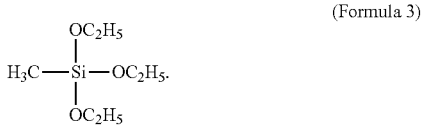

6. A method according to claim 1, wherein the aqueous curable imprintable medium further comprises a sensitizer to generate the acid or base from the photo-acid generator or the photo-base generator.

7. A method according to claim 1, wherein the aqueous curable imprintable medium comprises less than about 1 wt % PGMEA.

8. A method according to claim 1, wherein the at least second curable compound is selected from the group consisting of Formulas 4 and 5:

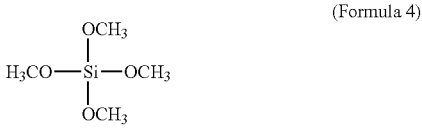

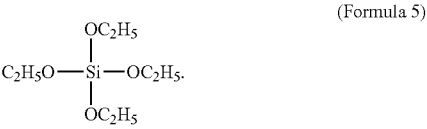

9. A method according to claim 1, wherein the aqueous curable imprintable medium comprises water of 10 wt % or less, an organic solvent, and less than 1 wt % of the photo-acid generator or photo-base generator.

10. A method according to claim 1, wherein the aqueous curable imprintable medium comprises the photo-acid generator and wherein the photo-acid generator is selected from the group comprising Irgacure PAG108®, Irgacure PAG103®, Irgacure PAG203® and Irgacure PAG121®.

11. A method according to claim 1, wherein the aqueous curable imprintable medium further comprises a luminescent material.

12. A patterned layer formed from a curable imprintable medium according to the method of claim 1.

13. An electronic or optical device comprising a patterned layer according to claim 12.

* * * * *